United States Patent [19]

Gantzhorn, Jr. et al.

[11] Patent Number: 5,006,182
[45] Date of Patent: Apr. 9, 1991

[54] METHOD FOR FABRICATING MULTILAYER CIRCUITS

[75] Inventors: John E. Gantzhorn, Jr., Hockessin; Steven R. Nann, Newark, both of Del.

[73] Assignee: E. I. Du Pont de Nemours and Company, Wilmington, Del.

[21] Appl. No.: 438,653

[22] Filed: Nov. 17, 1989

[51] Int. Cl.$^5$ ............................................. B32B 31/26
[52] U.S. Cl. ................................... 156/089; 156/286; 29/851; 264/58; 264/65
[58] Field of Search .................... 29/851; 156/89, 285, 156/286; 264/58, 65

[56] References Cited

U.S. PATENT DOCUMENTS

| | | | |
|---|---|---|---|
| 4,654,095 | 3/1987 | Steinberg | 156/89 |
| 4,655,864 | 4/1987 | Rellick | 156/89 |
| 4,806,188 | 2/1989 | Rellick | 156/89 |
| 4,867,935 | 9/1989 | Morrison, Jr. | 156/89 X |
| 4,927,733 | 5/1990 | Stout | 156/285 X |

Primary Examiner—Michael W. Ball
Assistant Examiner—Mark A. Osele

[57] ABSTRACT

A method for fabricating multilayer circuits comprising patterned conductive layers separated by dielectric layers and connected by vias in the dielectric, wherein the unfired dielectric layers are laminated as tapes or sheets over either a fired or unfired conductor layer while under a vacuum.

17 Claims, 11 Drawing Sheets

METHOD FOR FABRICATING MULTILAYER CIRCUITS

FIELD OF THE INVENTION

The invention is directed to a method for making multilayer circuits, particularly multilayer circuits comprising dielectric tapes or sheets and thick film conductive pastes.

BACKGROUND

Complex electronic circuits are generally constructed of several conductive layers separated by insulating dielectric layers. The conductive layers are interconnected by electrically conductive pathways or vias through the dielectric. This multilayer construction allows significantly smaller circuit size than single layer circuit design.

In the production of a multilayer circuit, the conductive layer is generally printed onto the insulating layers. The conductive lines are very fine, in order to minimize circuit size. To assure the printing is accurate, and that subsequent layers are in the proper registration with lower layers, it is extremely important for the assembly to be dimensionally stable in the X-Y plane. Failure to create a dimensionally stable package results in shorted circuits, misaligned vias, and non-functioning circuits.

One method of creating dimensionally stable multilayer circuits is disclosed by Rellick in U.S. Pat. No. 4,806,188. In this method, a patterned conductive layer is applied to a dimensionally stable ceramic substrate, as depicted in FIG. 1A. The ceramic and conductive layer are then fired to consolidate the conductor layer, thereby providing a suitable surface for following layers. Next a dielectric tape is laminated over the conductor, vias are created and the assembly is refired. The vias are filled, fired, and another conductive layer is applied. The process is repeated until the desired number of layers are built up.

Firing is the most time consuming step in the process of manufacturing a multilayer circuit. Additionally, repeated firing negatively affects the printed conductor layer because the metallization tends to diffuse into the dielectric or contract causing incomplete circuitry. It is therefore desirable to minimize the number of times an assembly must be fired. Rellick suggested eliminating the firing step between forming and filling vias, as shown in FIG. 1B. He also suggested eliminating the firing step between filling vias and printing the conductive layer over the dielectric tape, as depicted in FIG. 1C, and eliminating both firing steps, as shown in FIG. 1D. However, Rellick does not suggest eliminating the first firing step which must occur between printing the conductor and laminating the dielectric tape to the conductor layer.

Elimination of the first firing step in the Rellick process typically results in poor lamination between the ceramic substrate and the dielectric tape layer and therefore an unacceptable multilayer circuit. One cause of such poor lamination is conductor height. When the conductive layer is fired as in Rellick's method, its height is reduced by approximately 50%. The dielectric tape laminated over the conductor can then more easily conform to this lower profile, fired, conductive layer than it can to a high profile, unfired, conductive layer. Therefore, not firing before applying the dielectric tape negatively impacts adhesion under Rellick's method.

Generally, poor adhesion during a lamination process is cured by increasing the laminating pressure. However, in Rellick's method, simply increasing pressure does not solve the poor adhesion problem and in addition creates a "high pressure defect" in the part. This defect is realized as a rough topography which reduces the accuracy of conductive patterns and via patterns in layers laminated over the hills and valleys of the effected assembly. The present invention overcomes these problems of poor lamination of dielectric tape to an unfired conductive layer, the "high pressure defect", and allows elimination of one or more firing steps when forming a multilayer circuit.

SUMMARY

The present invention permits lamination of an unfired dielectric tape to an unfired conductor layer thereby providing a more efficient method of fabricating multilayer circuits utilizing thick film conductive layers than has heretofore been available. In addition, the present invention produces superior multilayer circuits using the multiple firing step approach. The products of the invention have excellent dimensional stability and very good adhesion between laminated conductive and dielectric surfaces.

In a first aspect, the invention is directed to a method for the fabrication of multilayer circuits comprising the sequential steps of:
(a) applying to an electrically non-conducting layer a patterned conductive layer in registry with the vias, if any, in the non-conducting layer;
(b) laminating to the conductive layer and exposed areas of the non-conducting layer a dielectric layer while under vacuum, at least one of the electrically non-conducting layer and dielectric layer being an unfired dielectric tape optionally having a via pattern formed therein which is in registry with the patterned conductive layer;
(c) if the unfired dielectric tape of step (b) lacks a via pattern, forming vias in selected positions through the layer of unfired dielectric tape in registration with the patterned conductive layer;
(d) firing the assemblage of step (c);
(e) filling the vias in the dielectric tape with a conductive metallization;
(f) firing the assemblage of step (e);
(g) applying a patterned conductive layer to the dielectric tape in registry with the vias therein; and
(h) firing the assemblage of step (g).

In a second aspect, the invention is directed to a method for the fabrication of multilayer circuits comprising the sequential steps of:
(a) applying to an electrically insulative substrate a patterned conductive layer;
(b) firing the assemblage of step (a);
(c) laminating to the conductive layer and exposed areas of the substrate while under vacuum a layer of unfired dielectric tape optionally having a via pattern therein which is in registry with the patterned conductive layer;
(d) if the unfired dielectric tape of step (c) lacks a via pattern, forming vias in selected positions through the layer of unfired dielectric tape in registration with the patterned conductive layer of step (b);
(e) firing the assemblage of step (d);
(f) filling the vias in the dielectric tape with a conductive metallization;
(g) firing the assemblage of step (f);

(h) applying a patterned conductive layer to the dielectric tape layer in registry with the vias therein;

(i) firing the assemblage of step (h).

(j) in the event the multilayer circuit requires more than two layers having conductive patterns, repeating the sequence of steps (c) through (i) until the desired number of circuit layers has been obtained.

The invention is further directed to the foregoing methods wherein additional conductive and dielectric layers are added and various firing steps are omitted.

DETAILED DESCRIPTION OF THE INVENTION

Figure 1A:
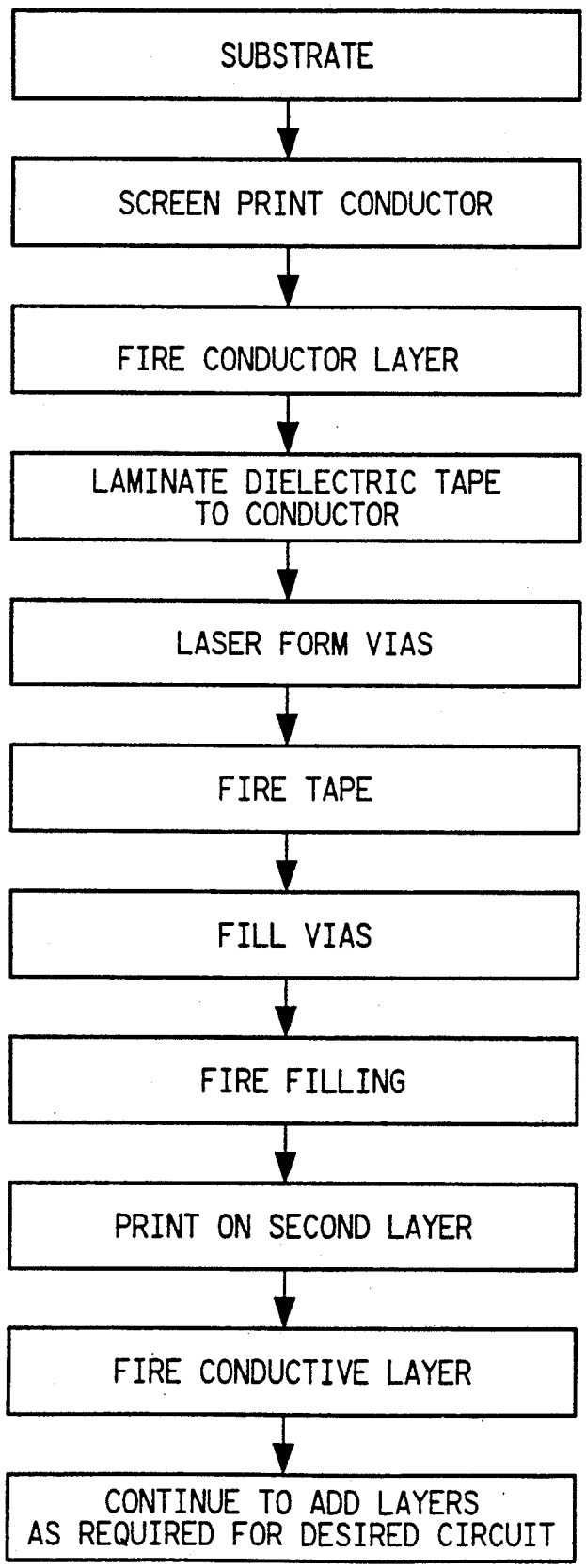
FIGS. 1A-1D are flow diagrams depicting four aspects of the U.S. Pat. No. 4,806,188 method.
Figure 1B:
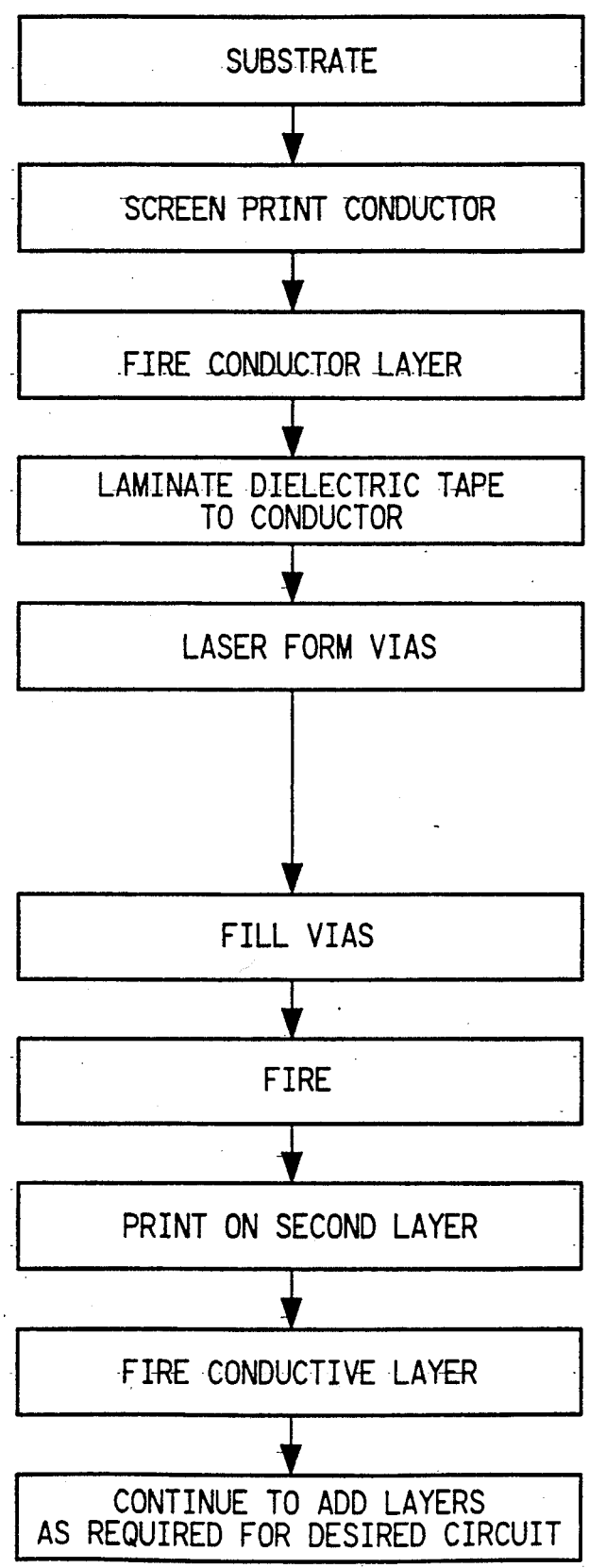
Figure 1C:
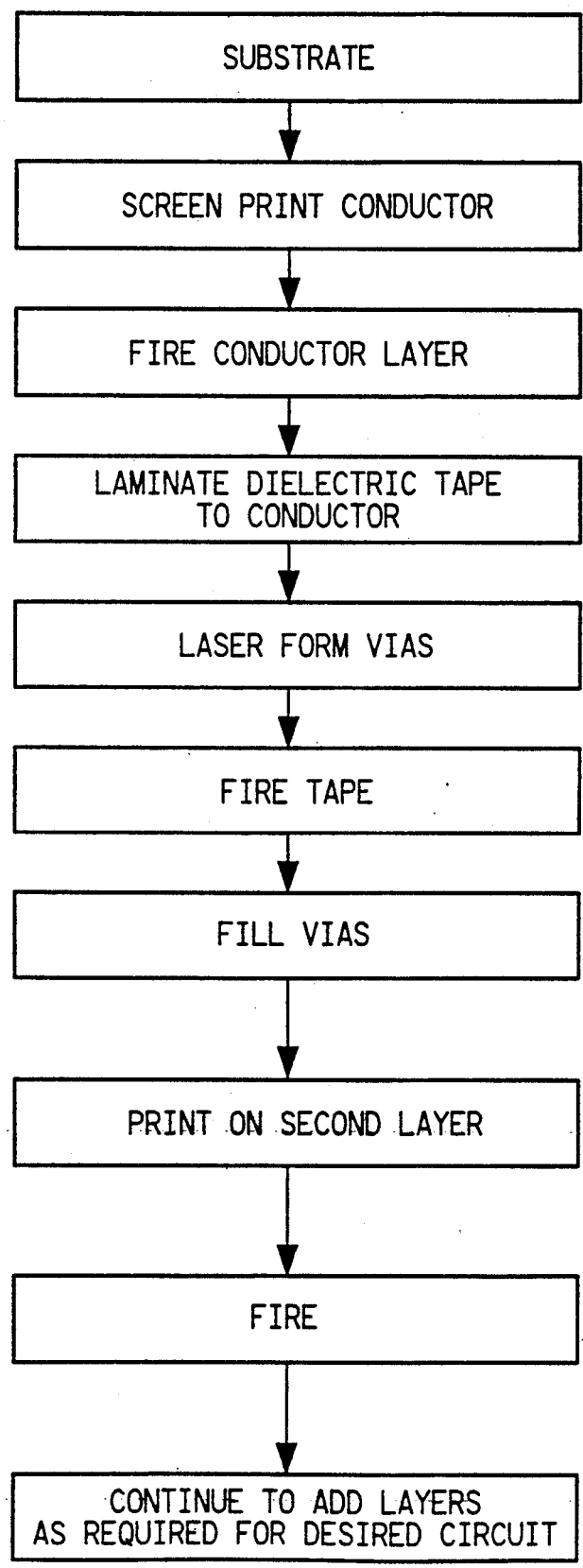
Figure 1D:
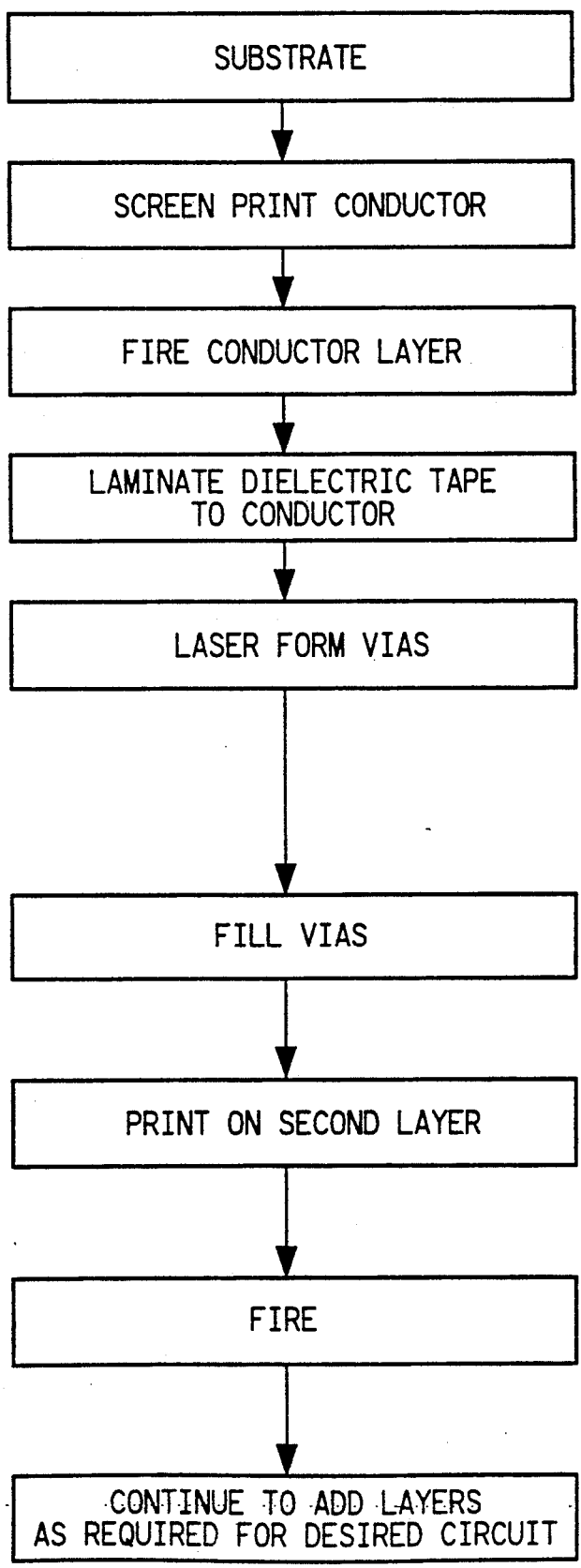

Applicants research has revealed that the "high pressure defects" created by lamination of unfired tape over an unfired conductive layer are due to air trapped between the ceramic substrate and the dielectric tape and within the tape itself. Under very high pressure, it cannot escape and results in air bubbles in the final product which are responsible for the "high pressure defects". To eliminate these air bubbles, Applicants' invention process includes laminating an unfired dielectric tape under a vacuum. This permits omission of the first firing step in the Rellick process, the production of multilayer circuits using a single firing step at the end of layer assembly (i.e. a cofired product) and a broader range of suitable lamination conditions, such as higher pressures. Surprisingly, when the first firing step is omitted and the conductive layer and dielectric tape layer are cofired the product has a smoother surface topography than the product made by firing the conductive layer and the dielectric tape layer separately. It was also unexpected that lamination of an unfired dielectric tape over either a fired or unfired conductive layer under a vacuum at higher pressures reduces and, in some cases, eliminates undesirable edge and via lips.

A multilayer circuit is commonly comprised of a dimensionally stable, non-conducting substrate, one or more conductive layers and a layer of dielectric tape separating each of the conductive layers. Vias filled with conductive metallization are provided in the dielectric tape layers to create electrical connections between conductive layers.

Substrates useful for making a multilayer circuit may be any dimensionally stable material that will remain stable at the typical elevated firing temperatures of about 850°-950° C. and elevated lamination pressures of up to approximately 6000 psi. Substrates commonly used are electrically insulative ceramic materials, such as alumina, fired dielectric tapes, and fired laminates of ceramic and dielectric tape.

The conductive layer is generally screen printed onto the substrate in the case of the first layer or onto the dielectric tape for subsequent layers. Alternatively, the conductive layer may be screen printed onto an unfired dielectric tape which is then laminated to the substrate or exposed dielectric tape such that the conductive layer lies between the two insulative layers. The conductive layer is generally thick film paste, and is printed in the appropriate circuit pattern for the particular layer. Instead of screen printing, the conductive layer could also be applied by a thick film writer. The technology described is also useful for thin films.

The unfired dielectric tape layer(s) are laminated to the conductive layer and/or exposed dielectric surface using traditional laminating techniques with the exception of providing vacuum during the lamination process to remove air that would otherwise be trapped within the finished laminate. Preferred conditions for lamination are a temperature of 45°-65° C., a pressure of 500-4000 psi and a vacuum pressure of 15-24 inches of mercury.

Vias in the dielectric layer are formed either before the tape is laminated in place, or after the lamination process is complete. In the case of preformed vias, any convenient method, such as hole punching or laser drilling is acceptable. In the case of post- formed vias, laser drilling is especially attractive. Laser drilling after lamination is preferred, because more accurate registration is possible on the hard laminated surface than the relatively flexible dielectric tape.

Vias may be filled by screen printing a thick film conductive paste directly into the formed vias. Alternately, they may be filled during screen printing of a subsequent conductive layer.

Firing for any of the various firing steps mentioned is typically conducted at about 850° C. for approximately one hour. All of the foregoing substrates, thick film pastes, dielectric tape, printing and laminating methods are well known in the art and easily understood by one skilled in the art of multilayer thick film circuits. Likewise, the process steps of the invention can be carried out in equipment typically used in the manufacture of multilayer circuits, with the exception of providing vacuum capability to the traditional laminating machines.

A preferred method of the present invention comprises the sequential steps of:

(a) providing a dimensionally stable, electrically insulative substrate;

(b) printing a patterned conductive layer on the substrate;

(c) laminating to the dry conductive layer and exposed areas of the substrate a layer of unfired dielectric tape while under vacuum;

(d) forming vias in selected positions through the layer of unfired dielectric tape in registration with the patterned conductive layer of step (c);

(e) firing the patterned conductive layer of step (d) and the laminated dielectric tape of step (c);

(f) filling the vias in the dielectric tape layer with a conductive metallization;

(g) firing the filled vias in the dielectric tape layer;

(h) applying a patterned conductive layer to the dielectric tape layer in registry with the vias therein;

(i) firing the patterned conductive layer if this is the final layer, or;

(j) in the event the multilayer circuit requires more than two layers having conductive patterns, repeating the sequence of steps (c) through (i).

Figure 2A:
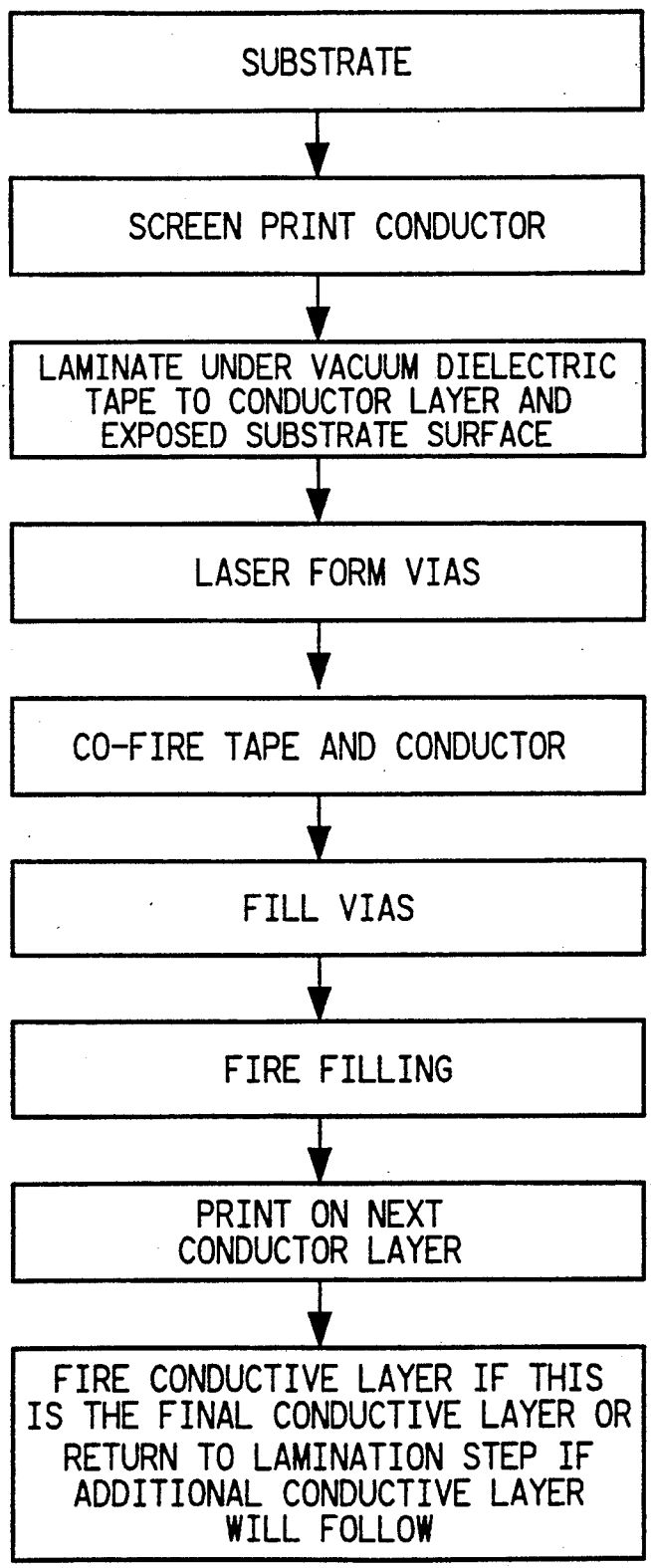
FIGS. 2A-2E are flow diagrams depicting five aspects of the present invention.

This sequence of steps is depicted in the flow diagram of FIG. 2A. The key to eliminating the firing step between printing the conductor and laminating the unfired dielectric tape to the conductor layer is applying a vacuum to the assembly during the lamination process. Providing a vacuum allows air trapped beneath and within the dielectric tape to be evacuated. Therefore, higher pressure can be applied without trapping air and risking incomplete lamination due to entrapped air. This air, when under high compression during the lamination step will otherwise tend to create defects in the dielectric layer upon release of the pressure. Elimination of the firing step is also a significant process improvement because approximately one hour is required to fire each conductive layer. For multilayer circuits, this eliminates a minimum of one hour for a two layer board, three hours for commonly manufactured four layer boards and so on. In addition, the reduction in number of firings minimizes damage to previous layers.

Figure 2B:
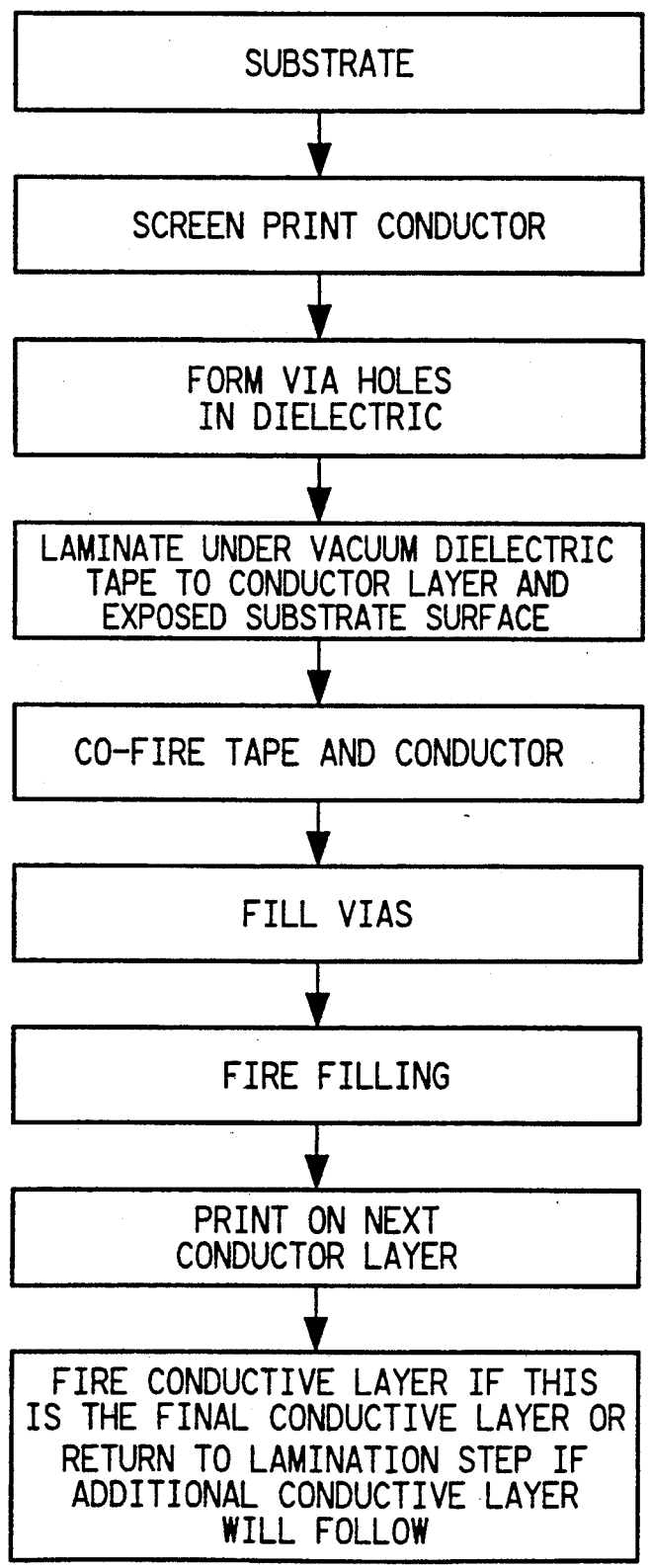
Figure 2C:
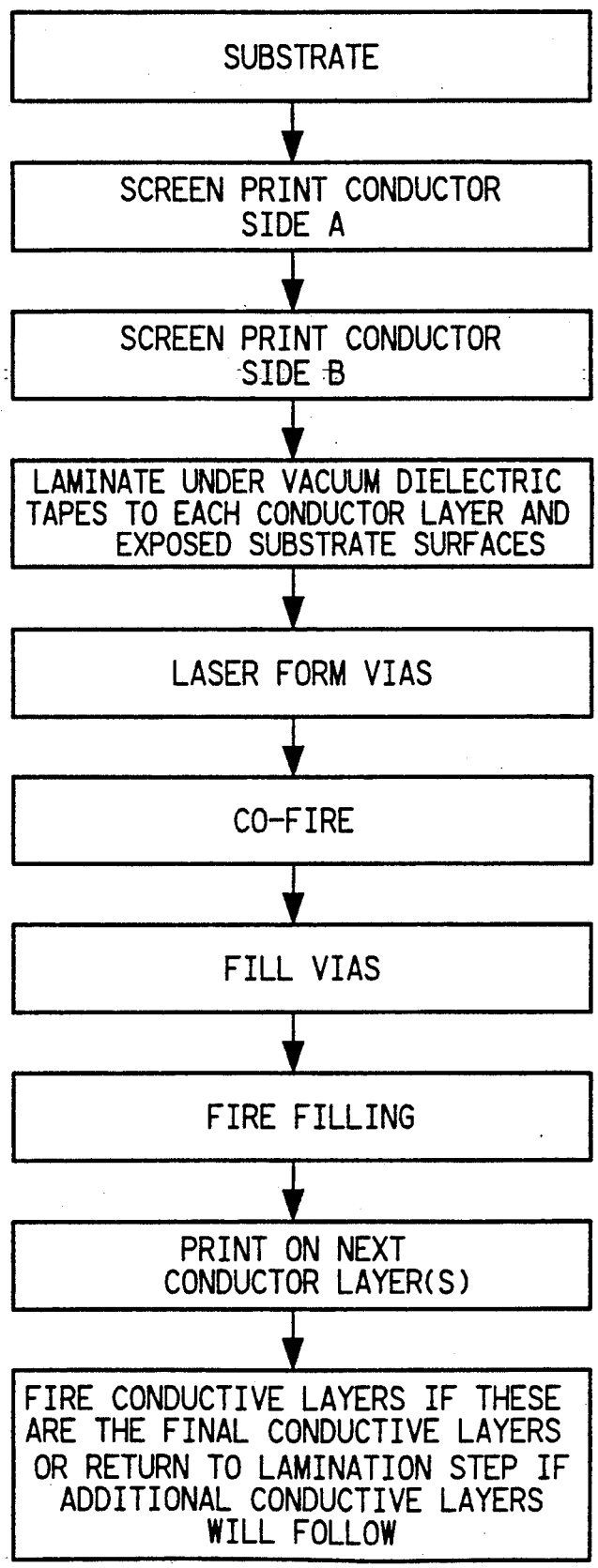
Figure 2D:
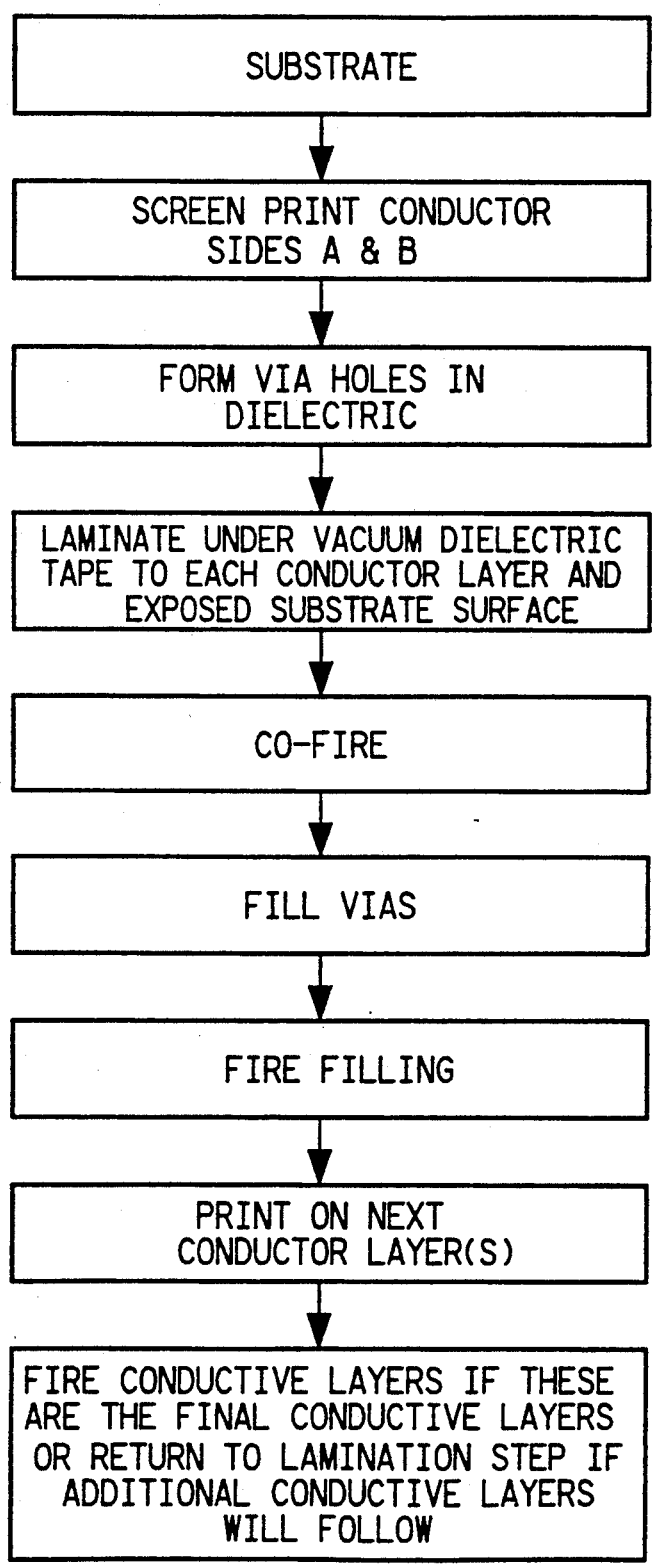

Many variations on the basic method exist. Vias may be formed in the dielectric tape layer by laser drilling holes at selected locations after the tape has been applied to the conductive layer as suggested above. Alternately, holes may be formed in the tape layer prior to putting the tape layer onto the conductive layer, either mechanically or by laser drilling, as shown in FIG. 2B. Additionally, the method may be used to create multilayer circuits with thick film conductive layers and dielectric tape layers applied to both sides of the substrate or the more traditional single side construction, FIGS. 2C and 2D. The firings described after forming vias and filling vias may also be eliminated in certain instances as suggested earlier by Rellick.

Figure 2E:
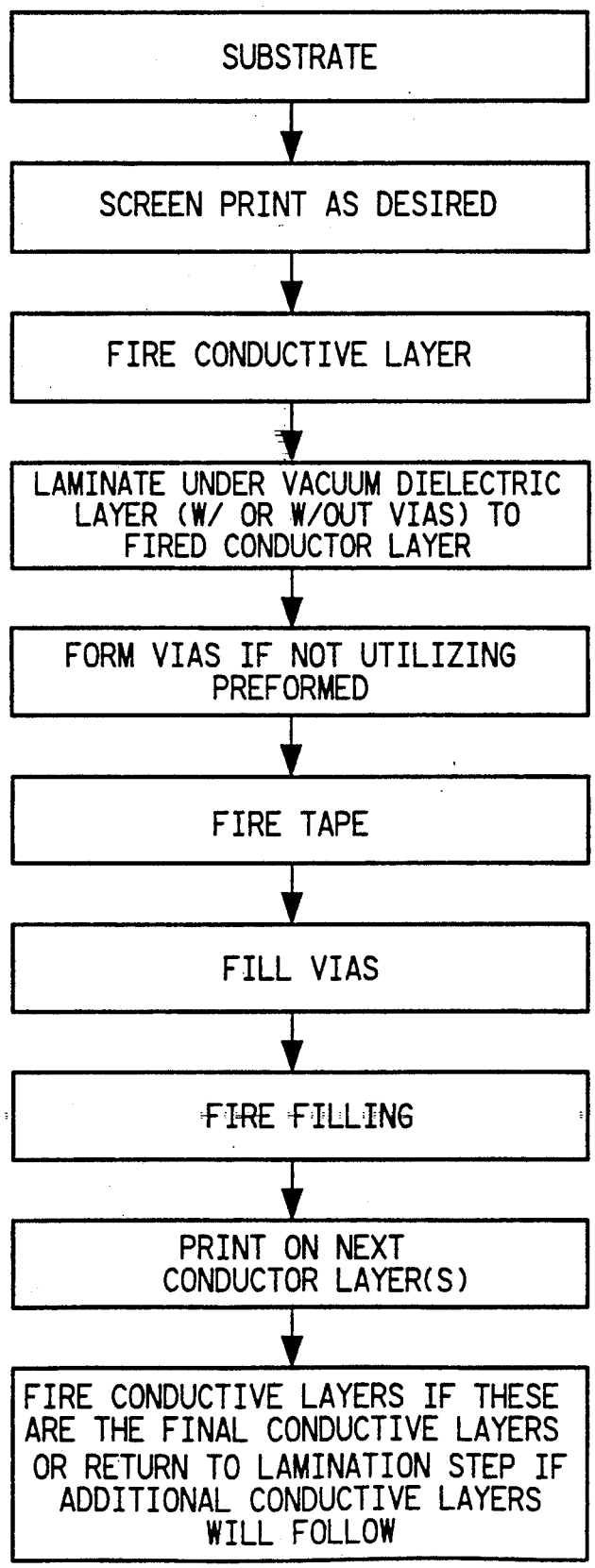

The application of vacuum during the lamination step is also advantageous when firing after each individual layer FIG. 2E. Using vacuum allows higher pressure during lamination because the entrapped air problem is solved. Edge lips and via lips (due to incomplete lamination) are minimized with higher pressures. The higher pressure also may allow shorter lamination periods in certain processes.

Figure 3:
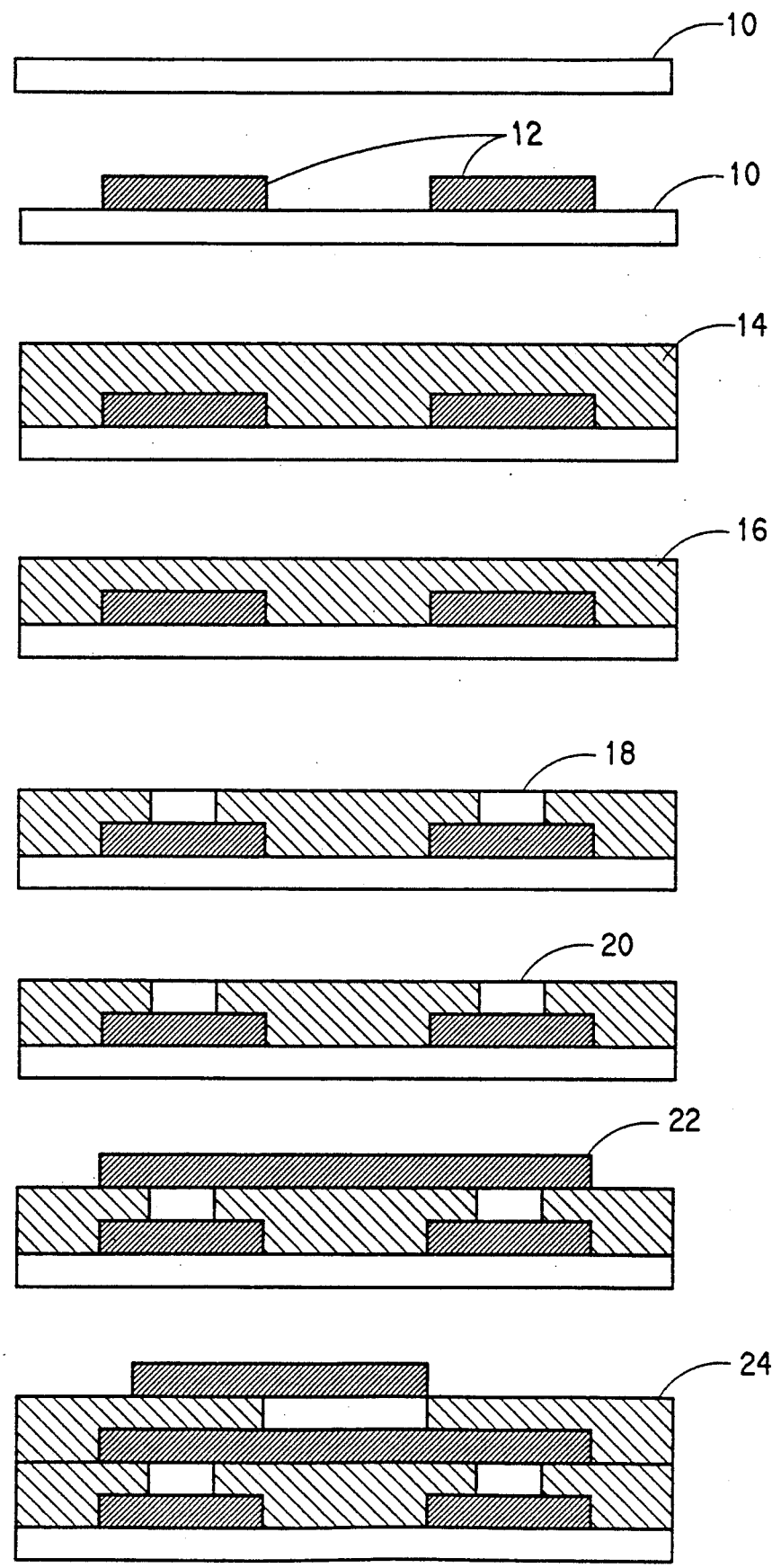
FIGS. 3 and 4 are schematic representations of multilayer circuits assembled by preferred embodiments of the present invention.

FIG. 3 is a schematic of the flow diagram depicted in FIG. 2A. A rigid alumina substrate 10 is screen printed with a patterned conductive thick film paste 12. An unfired dielectric tape 14 is laminated over the top of the conductor pattern 12 and exposed substrate 10. Alternatively, the conductive paste can be screen printed in the desired pattern onto the unfired dielectric and the conductor pattern and exposed surface of the tape laminated to the substrate. The resulting assembly is typically laminated at 58° C., 2,000 psi, and 20 in. Hg for approximately one minute. Vias 18 are formed by directing a $CO_2$ or YAG laser beam at 10–20 watts in the appropriate locations. At this point, the patterned conductive layer and dielectric tape can be fired at 850° C. for about one hour. The result is a well consolidated assembly 16 with smooth topography. The smooth topography is an advantage when printing subsequent conductive layers. The degree of smoothness directly affects the accuracy at which the conductive pattern can be printed. It has been found that cofiring tends to produce a smoother topography than sequential firing of conductor and dielectric layers. The vias are then filled with conductive paste 20 and fired at about 850° C. for about one hour or the vias can be filled before the first firing step, thereby eliminating the need for this second firing step. A second conductive layer 22 is applied. For a simple two layer circuit, this is followed by the final firing. The via fill also may be cofired with the top conductor. In case one or more layers follow the second conductive layer, the steps of laminating, firing, forming, filling and firing are repeated. A typical three layer hybrid is shown as construct 24.

Figure 4:
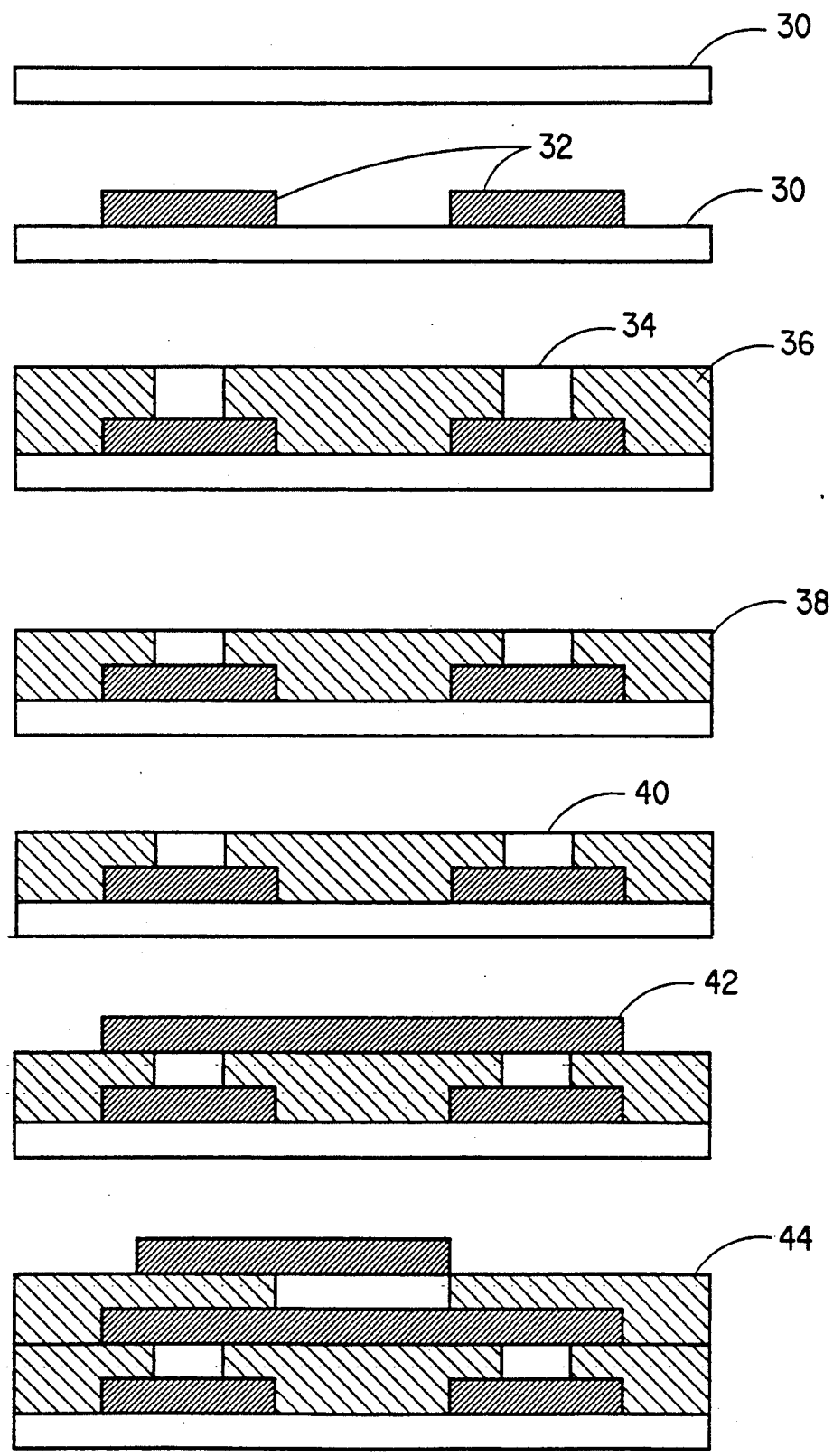

FIG. 4 depicts a process similar to that detailed by FIG. 3, with the exception that dielectric layers with preformed vias are used. Lamination and firing conditions remain the same as in the previous example. A rigid alumina substrate 30 is printed with first conductive layer 32. The first dielectric layer 36 with preformed vias 34 is laminated on top and cofired to form the well consolidated assembly 38. Alternatively, the conductive paste can be screen printed in the desired pattern onto the unfired dielectric in registry with the via pattern, and the conductor pattern and exposed surface of the tape laminated to the substrate. The vias are filled with conductive past 40 and a second conductive layer 42 is applied. If desired, the vias can also be filled during the application of the conductive layer- either the first conductive layer if it is applied to the unfired tape as described above or the second conductive layer. As with the previous example, for two layer circuits this is followed by a final firing. For higher layer counts, the laminating, firing, filling and firing steps are repeated until the desired number of layers are formed. A typical three layer hybrid is shown as construct 44.

It is to be understood that the forms of the invention shown and described herein are but preferred embodiments and various changes may be made without departing from the spirit and scope of the invention. For example, any combination of the firing steps can be omitted from the process provided the last layer is fired. Thus, the entire multilayer assemblage can be cofired in a single firing step after all the layers have been applied. Additionally, the sequence of steps for building additional layers need not be identical to the sequence used to form other layers in the same construct. For example, a three layer circuit can be fabricated by the following sequence of steps:

(a) apply a patterned conductive layer to a dimensionally stable, insulative substrate;
(b) laminate an unfired dielectric tape over the conductive layer and exposed areas of the substrate to form an assemblage;
(c) form vias in selected positions through the layer of unfired tape in registry with the patterned conductive layer;
(d) fill the vias in the dielectric tape of the assemblage with a conductive metallization;
(e) apply a patterned conductive layer to unfired dielectric tape having a preformed pattern of vias such that the conductive layer registers with the via pattern;
(f) laminating the conductive pattern and exposed surface of the unfired tape to the unfired tape of the assemblage such that the conductive layer registers with the via pattern of the assemblage;
(g) filling the vias of the exposed tape layer;
(h) applying a patterned conductive layer to the exposed tape layer in registry with the via pattern; and
(i) firing the assemblage of step (h).

We claim:
1. A method for the fabrication of multilayer circuits comprising the sequential steps of:
(a) applying to an electrically non-conducting layer a patterned conductive layer in registry with the vias, if any, formed in the non-conducting layer;
(b) laminating to the conductive layer and exposed areas of the non-conducting layer a dielectric layer while under vacuum, at least one of the electrically non-conducting layer(s) and dielectric layer(s) being an unfired dielectric tape optionally having a via pattern formed therein which is in registry with the patterned conductive layer;

(c) if the unfired dielectric tape of step (b) lacks a via pattern, forming vias in selected positions through the layer of unfired dielectric tape in registration with the patterned conductive layer;
(d) firing the assemblage of step (c);
(e) filling the vias in the dielectric tape with a conductive metallization;
(f) firing the assemblage of step (e);
(g) applying a patterned conductive layer to the dielectric tape in registry with the vias therein; and
(h) firing the assemblage of step (g).

2. The method of claim 1 wherein a patterned conductive layer is applied to both sides of the non-conducting layer.

3. The method of claim 1 further comprising the sequential steps of:
(i) laminating a dielectric tape layer to the patterned conductive layer and exposed areas of the dielectric tape layer; and
(j) firing the assemblage of step (i).

4. The method of claim 1 further comprising between steps (f) and (g) the step of:
(f) repeating the sequence of steps (a) through (f) until the desired number of circuit layers has been obtained.

5. The method of claim 4 further comprising the sequential steps of:
(i) laminating a dielectric tape layer to the patterned conductive layer and exposed areas of the dielectric tape layer; and
(j) firing the assemblage of step (i).

6. The method of claim 1 wherein firing steps (d) and/or (f) are omitted.

7. The method of claim 2 wherein firing steps (d) and/or (f) are omitted.

8. The method of claim 3 wherein any one or more of firing steps (d), (f), and (h) is omitted.

9. The method of claim 4 wherein any one or more of firing steps (d) and (f) is omitted from any cycle of steps (a) through (g).

10. The method of claim 5 wherein any one or more of firing steps (d), (f), and (h) is omitted from any cycle of steps (a) through (g).

11. The method of any one of claims 1 to 10 wherein one of the electrically non-conducting layer(s) or dielectric layer(s) is an unfired dielectric tape and the other is selected from the group consisting of a fired ceramic, a fired dielectric tape and the combination thereof.

12. A method for the fabrication of multilayer circuits comprising the sequential steps of:
(a) applying to an electrically insulative substrate a patterned conductive layer;
(b) firing the assemblage of step (a);
(c) laminating to the conductive layer and exposed areas of the substrate while under vacuum a layer of unfired dielectric tape optionally having a via pattern formed therein which is in registry with the patterned conductive layer;
(d) if the unfired dielectric tape of step (c) lacks a via pattern, forming vias in selected positions through the layer of unfired dielectric tape in registration with the patterned conductive layer of step (b);
(e) firing the assemblage of step (d);
(f) filling the vias in the dielectric tape with a conductive metallization;
(g) firing the assemblage of step (f);
(h) applying a patterned conductive layer to the dielectric tape layer in registry with the vias therein;
(i) firing the assemblage of step (h).
(j) in the event the multilayer circuit requires more than two layers having conductive patterns, repeating the sequence of steps (c) through (i) until the desired number of circuit layers has been obtained.

13. The method of claim 12 wherein a patterned conductive layer is applied to both sides of the electrically insulative substrate.

14. The method of claim 12 further comprising the sequential steps of:
(k) laminating a dielectric tape layer to the patterned conductive layer and exposed areas of the dielectric tape layer; and
(l) firing the assemblage of step (k).

15. The method of claim 12 wherein any one or more of firing steps (b), (e), (g) and (i) is omitted from any cycle of steps provided that step (b) is included in the first cycle and the last patterned conductive layer is fired.

16. The method of claim 13 wherein any one or more of firing steps (b), (e), (g) and (i) is omitted from any cycle of steps provided that step (b) is included in the first cycle and the last patterned conductive layer is fired.

17. The method of claim 14 wherein any one or more of firing steps (b), (e), (g) and (i) is omitted from any cycle of steps provided that step (b) is included in the first cycle.

* * * * *